United States Patent [19]

Mader

[11] Patent Number: 4,849,804
[45] Date of Patent: Jul. 18, 1989

[54] FABRICATION OF INTEGRATED CIRCUITS INCORPORATING IN-PROCESS AVOIDANCE OF CIRCUIT-KILLER PARTICLES

[75] Inventor: James M. Mader, Indialantic, Fla.

[73] Assignee: Harris Corp., Melbourne, Fla.

[21] Appl. No.: 777,451

[22] Filed: Sep. 18, 1985

[51] Int. Cl.$^4$ ............................................. H01L 49/00
[52] U.S. Cl. ..................................... 357/85; 29/592.1; 357/88; 361/397; 361/411; 428/901
[58] Field of Search ................ 29/574; 361/397, 411; 428/901; 359/85, 88

[56] References Cited

U.S. PATENT DOCUMENTS

| | | | |
|---|---|---|---|
| 3,939,178 | 2/1976 | Miura et al. | 29/578 |
| 4,022,931 | 5/1977 | Black et al. | 29/591 |
| 4,089,103 | 5/1978 | Hendrickson et al. | 29/578 |
| 4,478,655 | 10/1984 | Nagakubo et al. | 29/578 |
| 4,523,369 | 6/1985 | Nagakubo | 29/578 |

Primary Examiner—Stephen J. Lechert, Jr.
Attorney, Agent, or Firm—Antonelli Terry & Wands

[57] ABSTRACT

In the manufacture of an integrated circuit, steps of the process are dynamically augmented, so as to fabricate the integrated circuit at wafer locations which avoid the presence of circuit-killing particulates. During the respective steps of fabrication, the components employed in the process are scanned to locate and identify particulates. This information is compared with a previously defined component/interconnect layout to determine whether the particulates reside at locations that will not detrimentally impact the completed circuit or whether further processing will incorporate the defect into the circuit and render it effectively useless. In this latter circumstance the intended geometries of the circuit are modified, so as to effectively rearrange or shift prescribed components (e.g. semiconductor regions, contact apertures, interconnect tracks) to a location of the wafer which are not coincident with the location of the particulates.

13 Claims, 10 Drawing Sheets

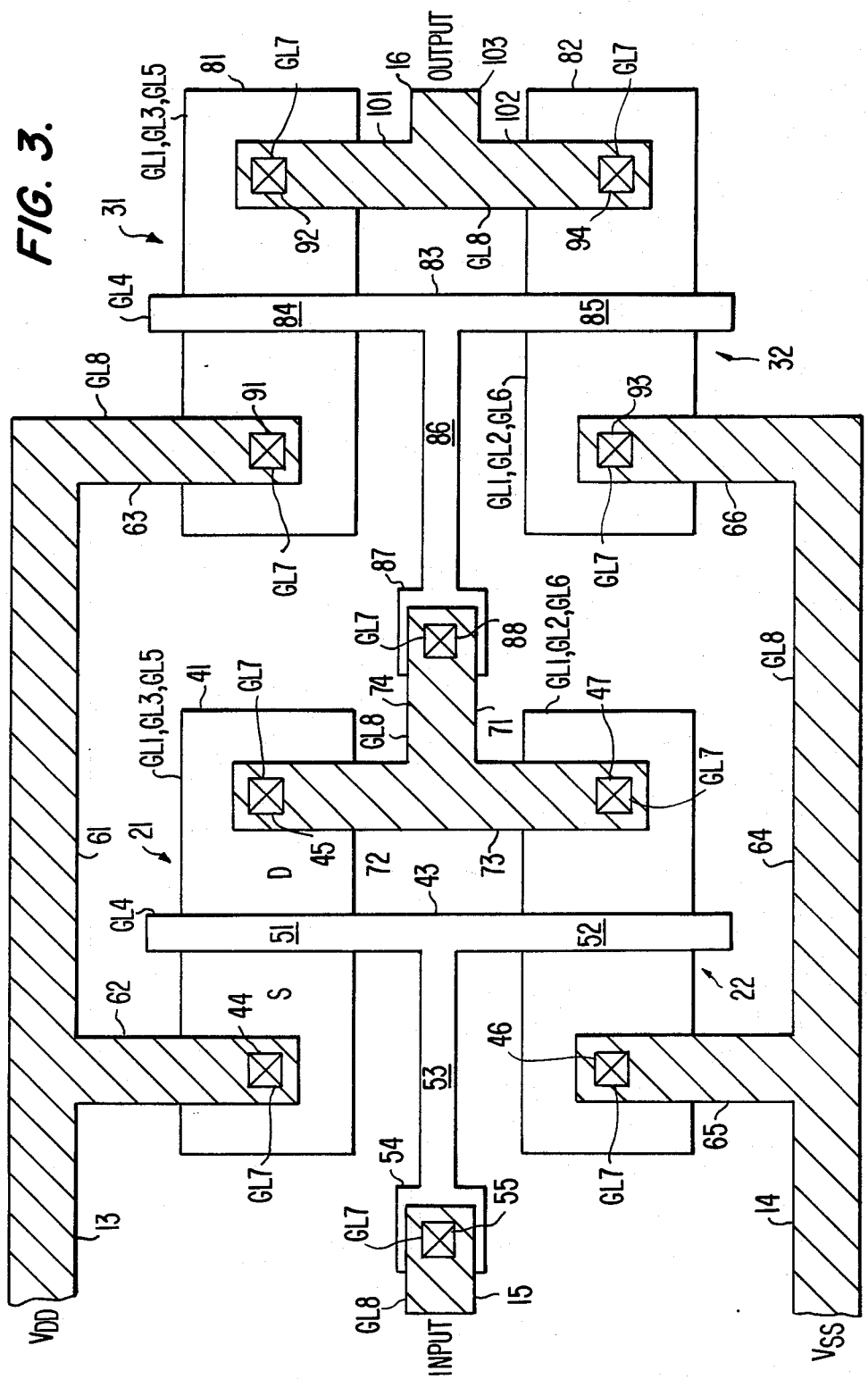

FABRICATION OF INTEGRATED CIRCUITS INCORPORATING IN-PROCESS AVOIDANCE OF CIRCUIT-KILLER PARTICLES

FIELD OF THE INVENTION

The present invention relates to the manufacture of integrated circuits, and is particularly directed to a fabrication methodology for increasing wafer probe yield by incorporating, in the manufacturing process, defect-avoidance processing steps through which the impact of "circuit-killing" particulate defects is substantially reduced.

BACKGROUND OF THE INVENTION

With the continuing increase in the architecture complexity and integration density of semiconductor circuits, the impact of particulate defects is a significant control factor in wafer probe yield. The potential of the particulates to effectively negate or "kill" a circuit depends upon their location on the wafer (i.e. coincidence with a circuit element) and also upon minimum feature size (MFS), namely, the smallest geometry of one or more of the process mask levels. In the manufacture of CMOS devices, for example, MFS is usually determined by gate length, contact aperture size or metal width/spacing. Yield analysis of a number of bulk CMOS processes having a minimum feature size ranging from 0.5 to 3 microns has suggested that only particles of a size greater than one-fifth of the minimum feature size are potential "killer" particles for that process. Thus, for a three micron MFS fabrication process only particles greater than $0.5\mu$ are potentially fatal.

Processing complexity, which is a natural consequence of integration density and circuit design complexity, depends upon the number of critical steps which, in turn, are related to the number of masking operations. Thus, increases in processing complexity and integration density, for a constant minimum feature size, have been accompanied by a significant increase in circuit killer particle density. Namely, as circuit density is increased (other than by decreasing MFS), the likelihood of an existing particulate defect killing a circuit (of constant area) increases.

Historically, efforts to decrease the density of killer particles have principally involved increased attention to sources of the particulates, i.e. cleanliness. The progression rate at which the introduction of particles into the manufacturing process can be prefiltered out, however, is relatively sluggish; at the current progression rate of 25% per year it is estimated that it would take five years to increase wafer probe yield from 10% to 30% under constant MFS conditions, which effectively corresponds to being able to avoid one defect per circuit. It would take twelve years, at normal progression, to equal the yield improvement of avoiding two defects per circuit.

SUMMARY OF THE INVENTION

Rather than focus on improvements in filtering schemes for reducing the introduction of particulates into the manufacturing process, the evolution of which approach, as noted above, is fairly long term, the present invention provides an improvement in the wafer processing methodology, through which the respective steps of the process are dynamically augmented, so as to fabricate the elements of the integrated circuit of interest at locations which avoid the presence of particulates. For this purpose, during the respective steps of fabrication, the component (wafer) employed in the process is scanned by a topology image representative signal generating mechanism (e.g. E-beam scanner or laser scan apparatus) to locate and identify particulates. This information is compared with a previously stored component/interconnect layout to determine whether the particulates reside at locations that will not detrimentally impact the completed circuit or whether further processing will incorporate the defect into the circuit and render it effectively useless. In this latter circumstance the intended geometries of the circuit are modified, so as to effectively rearrange or shift prescribed components (e.g. semiconductor regions, contact apertures, interconnect tracks) to locations of the wafer which are not coincident with the location of the particulates.

Because the present invention provides a mechanism through which particulate defects can be effectively avoided, the wafer probe yield can be dramatically increased above the ten percent level considered acceptable for complex microcircuits using conventional processing methodologies. Identification and avoidance of up to five defects per circuit results in an increase in wafer yield as much as nine to one. Thus, in terms of the estimated time requested for yield improvement in the course of the evolution of conventional particulates filtering schemes, the present invention offers a yield improvement acceleration of ten-plus years.

BRIEF DESCRIPTION OF THE DRAWINGS

FIG. 3 is a diagrammatic illustration of the topology of an integrated circuit layout of the logic circuit of FIGS. 1 and 2;

DETAILED DESCRIPTION

As described briefly above, in accordance with the present invention, the respective processing steps of an integrated circuit fabrication methodology are dynamically updated in response to the identification of particulate defects the locations of which coincide with components of the circuits and thereby negate or "kill" the circuit function, rendering the completed circuit effectively useless. In order to facilitate an appreciation of the manner in which this particulate defect avoidance scheme is dynamically incorporated into the successive steps of wafer fabrication, the description below will illustrate the application of the invention to an exemplary environment of dual CMOS inverter logic circuit of the type typically contained in present day digital signal processing circuit architectures. It should be understood, however, that the present is not limited to the fabrication of this or any other particular integrated circuit. The example chosen is simply for illustrative purposes in explaining the invention.

Figure 1:
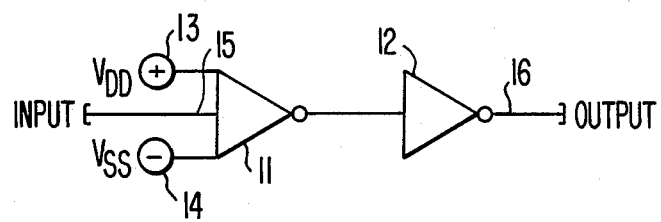
FIG. 1 is a logic diagram of a cascaded inverter logic circuit.

Referring now to FIG. 1, there is shown a schematic diagram of a dual CMOS inverter logic circuit which comprises a pair of inverters 11 and 12 connected in cascade, between an input line 15 and an output line 16. Bias supply voltage levels for the logic circuit are provided by way of respective positive ($+V_{DD}$) and negative ($-V_{SS}$) supply terminals 13 and 14. As pointed out above, each inverter circuit is configured in CMOS logic as a pair of opposite channel conductivity MOS field effect transistors the drain-source current flow paths of which are coupled in series between bias supply terminals 13 and 14.

Figure 2:
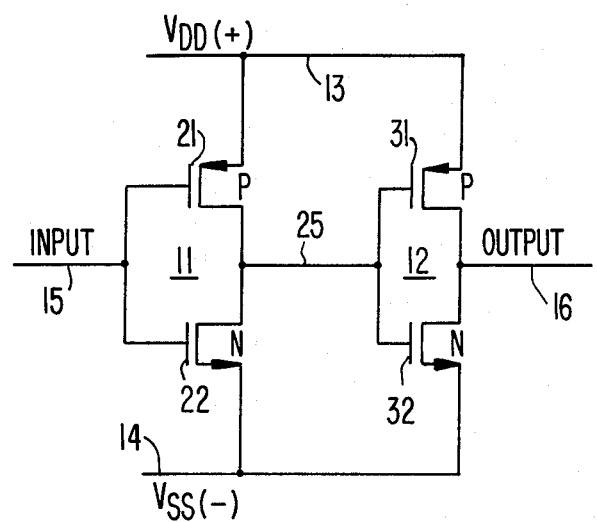
FIG. 2 is a schematic diagram of the configuration of the logic diagram of FIG. 1.

This circuit configuration is diagrammatically illustrated in FIG. 2 wherein inverter 11 is shown as comprising an N-channel driver field effect transistor 22 and a P-channel load field effect transistor 21, the gate electrodes of which are connected in common to input electrode 15 and the drain electrodes of which are connected in common to link 25 at the output of inverter 11. The source electrode of P-channel load transistor 21 is connected to $+V_{DD}$ supply line 13, while the source electrode of N-channel driver transistor 22 is connected to $-V_{SS}$ supply line 14. The commonly connected drain electrodes of transistors 21 and 22 of inverter 11 are coupled via link 25 to the commonly connected gate electrodes of N-channel driver transistor 32 and P-channel load transistor 31 of inverter 12. The drain electrodes of transistors 31 and 32 are connected in common to output electrode 16, while the source electrode of P-channel load transistor 31 is connected to voltage supply ($+V_{DD}$) line 13 and the source electrode of N-channel driver transistor 32 is connected to voltage supply ($-V_{SS}$) supply line 14.

In accordance with conventional semiconductor processing methodologies, in the course of mapping the schematic circuit diagram of FIG. 2 into an integrated circuit a prescribed topological layout of completed semiconductor architecture is prepared; then using this layout, patterning of the mask set employed in the respective steps of the wafer fabrication process is carried out, followed by fabrication of the circuit in a semiconductor (e.g. silicon) wafer using the patterned mask set. For obtaining the dual CMOS inverter logic circuit of FIG. 2, the processing methodology may comprise a silicon gate CMOS architecture formed on epitaxially layered sapphire (SOS). The processing steps for realizing such a semiconductor (silicon) implementation are associated with respective levels of geometry of the wafer, through which the components of the integrated circuit are dimensioned, namely the location and size of the transistor sites or islands in the epitaxial layer, the introduction of impurities for controlling the thresholds of the channels of the transistors, the polysilicon gate formation (gate material and interconnect), P and N drain/source dopants, contact apertures, and metal (e.g. aluminum) contacts and interconnects.

An exemplary composite integrated circuit topology for realizing the logic circuit architecture of FIG. 2, obtained by a series of processing steps for defining such levels of geometry, is depicted in FIG. 3. (For purposes of clarity, the insulation layers that exist between the respective levels of the wafer surface, the polysilicon gate and the interconnect metallization are omitted from FIG. 3.) As shown therein the four transistors 21, 22, 31, 32 of which the dual CMOS inverter circuit configuration of FIG. 2 is comprised are prescribed by a symmetrical arrangement of respective islands regions 41, 42, 81, 82 respectively. In FIG. 3 the shape of each island region is illustrated as rectangular, bisected by a polysilicon gate line, and having contact apertures for respective source and drain electrode metallization links.

More particularly, in that portion of the wafer containing transistors 21 and 22, a T-shaped polysilicon gate 43 is shown as having a base leg 53 extending to a square contact area 54 with a contact aperture 55 for the interconnect metal of input link 15. Arms 51 and 52 of T-shaped polysilicon gate layer 43 bisect the rectangular transistor island 41 of P-channel transistor 21 and the rectangular transistor island 42 of N-channel transistor 22, respectively. The common connection of the drains of transistors 21 and 22 is effected by way of a T-shaped metallization link 71, having respective arms 72 and 71 extending to drain contact apertures 45, 47 for connection to the right-hand (drain) portions of transistor island regions 41 and 42. The base leg 74 of metallization link 71 extends to a contact aperture 88 at a square contact area 87 of polysilicon link 83 for providing a cascade connection from the output of inverter 11 to the common gate connection for transistors 31 and 32 of inverter 12.

Electrical coupling from the respective positive ($+V_{DD}$) and negative ($-V_{SS}$) power supply links 13 and 14 to the source regions of island regions 41 and 42 containing transistors 21 and 22, respectively, is provided by way of metallization link arms 62 and 65 which extend from a positive power supply metallization link 61 and a negative supply metallization link 64, respectively, to source contact aperture 44 for island region 41 and source contact aperture 46 for island region 42, respectively. Additional arms 63 and 66 of these links extend to source contact apertures 91 and 93 for the respective source regions of rectangular island regions 81 and 82 of transistors 31 and 32, respectively. Like island regions 41 and 42, island regions 81 and 82 are bisected by respective arms 84 and 85 of a polysilicon gate link 83. The drain portions of rectangular islands 81 and 82 are coupled through contact apertures 92 and 94 to the respective arms 101 and 102 of a T-shaped metallization link, the base leg 103 of which extends as the output line 16, as shown in the right-hand portion of FIG. 3.

As pointed out previously, the topological layout of FIG. 3 is an exemplary illustration of the translation or mapping of the circuit shown in FIG. 2 into an integrated circuit architecture. It should be realized, of course, that other architectures, for the regions, metallization links and polysilicon lines may be employed to map the circuit of FIG. 2 into a semiconductor architecture. Thus, the layout of the semiconductor architecture shown in FIG. 3 is not to be considered as limitative of the invention; the design shown has been selected to facilitate an understanding of both the mapping and the dynamic modification of that mapping in accordance with the particular defect avoidance scheme of the present invention to be described in detail below.

As mentioned above, in the course of fabrication of the integrated circuit architecture shown in FIG. 3 to implement the desired circuit functions shown in FIG. 1 and 2, a series of processing steps associated with respective (masking) levels of geometry in the wafer are carried out. To facilitate the discussion to follow, these geometry (mask) levels have been identified in the circuit layout of FIG. 3 in accordance with the Table below. The effect of the present invention on these respective levels of geometry will be described in conjunction with the description of FIGS. 4–10.

TABLE

| Geometry Level (GL) | Region Designation | Function |
| --- | --- | --- |
| 1 | Silicon islands 41, 42, 81, 82 | Define areas where transistors are formed |
| 2 | P− implant | Control threshold of N-channel transistors 22, 32 |
| 3 | N− implant | Control threshold of P-channel transistors 21, 31 |
| 4 | Polysilicon gates 43, 83 | Transistor gate material 51, 52, 84, 85 and interconnects 53, 54, 86, 87 |
| 5 | P+ implant | Drain/source doping of P-channel devices 21, 31 |
| 6 | N+ implant | Drain/source doping of N-channel transistors 22, 32 |
| 7 | Contact (Via) | Openings 44, 45, 46, 47, 55, 88, 91, 92, 93 94 for contact metal to circuit regions |
| 8 | Interconnect metal (aluminum) | Transistor interconnection metal 13, 14, 15, 71, 16 |

Referring now to FIGS. 4–7, there are shown respective portions of the topologic layout of the integrated circuit architecture of FIG. 3 associated with one or more of the processing steps identified with a respective level of geometry as tabulated in the Table above. Also shown in FIGS. 4–7 are the modified locations of portions of topological layout patterns resulting from the identification and avoidance of particular defects that have been detected during the fabrication process.

Figure 3A:
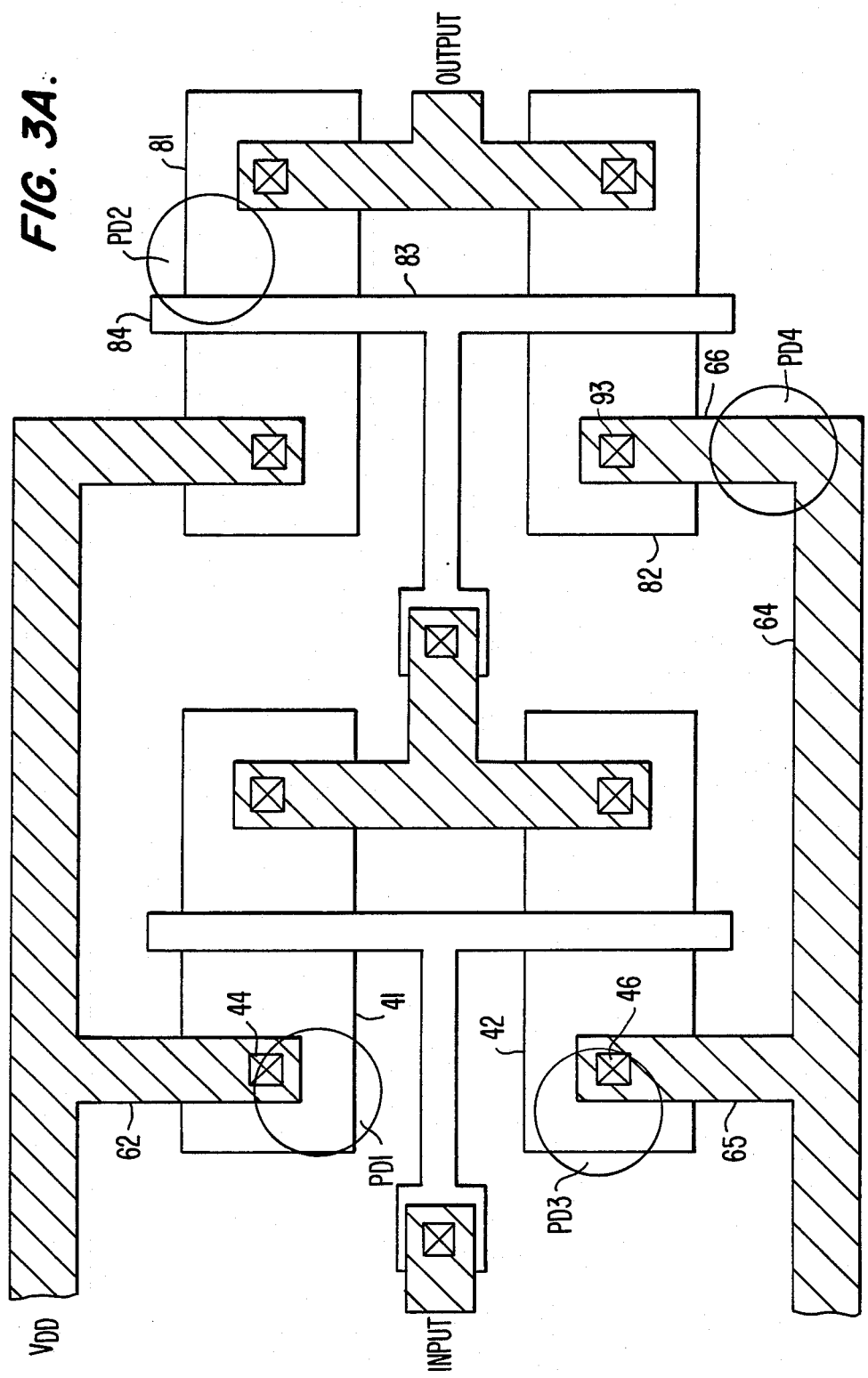
FIG. 3A is a diagrammatic illustration of the topology of the integrated circuit layout of FIG. 3, as impacted by a plurality of particulate defects.
Figure 4:
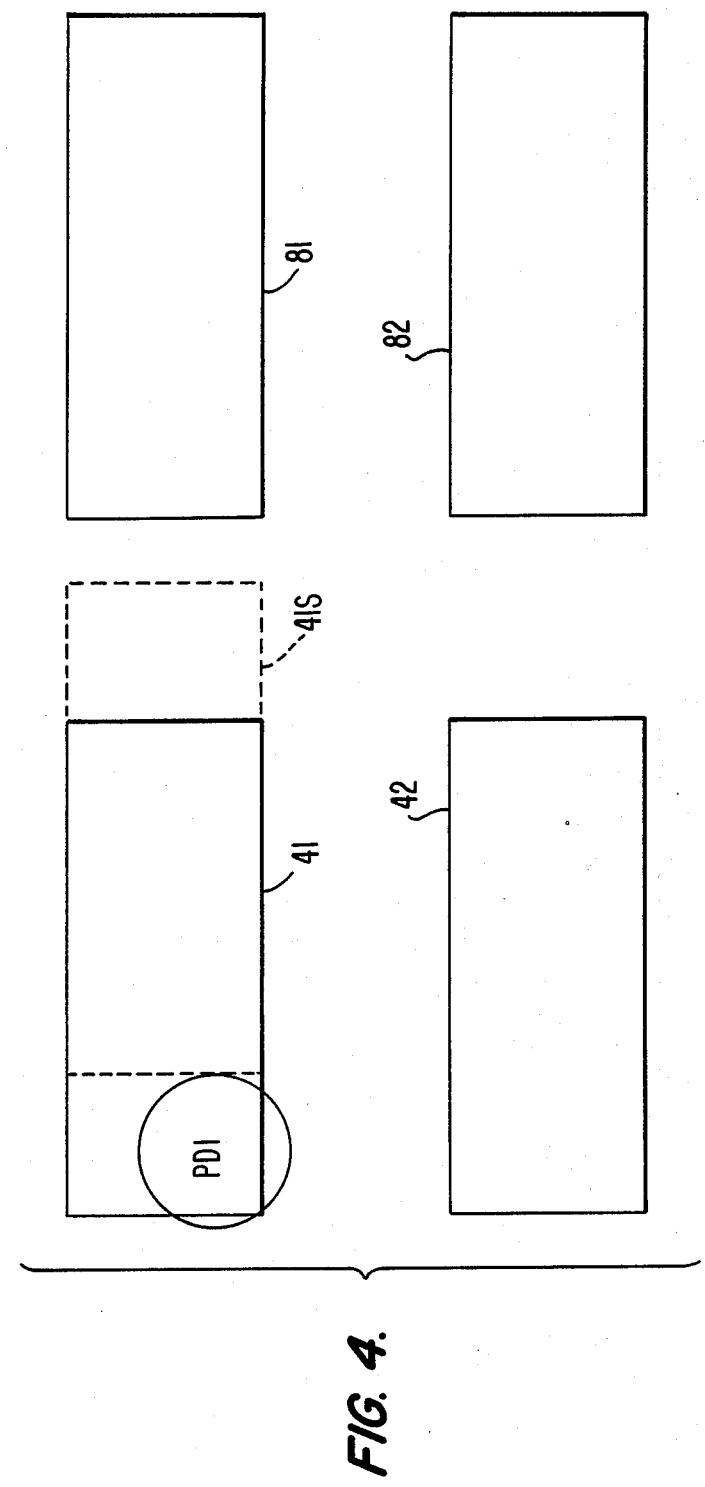
FIGS. 4–7 are diagrammatic illustrations of circuit masking patterns for realizing the integrated circuit topology of FIG. 3 and for avoiding particulate defects introduced thereto.

More particularly, FIG. 4 shows the intended arrangement and configuration of the respective transistor islands 41, 42, 81 and 82 that are to be formed in the semiconductor wafer in the course of the producing the overall layout of FIG. 3. Also shown in the upper left-hand portion of FIG. 4 is a particulate defect, identified by the encircled PD1 which, as shown in FIG. 3A, is coincident with the source contact aperture 44 and metallization arm 62 thereat, of the above described topology of FIG. 3. FIG. 3A also shows additional particulate defects PD2, PD3 and PD4 overlying respective portions of the topology of FIG. 3. The impact of these defects and the mechanism for avoiding the defect will be discussed below. As can be seen in FIG. 3A, if particulate defect PD1 were to be incorporated in the integrated circuit, it would effectively kill transistor 21. In accordance with the present invention this defect in island region 41 is effectively avoided by modifying the mechanism through which the island 41 is formed in the wafer, prior to executing the mechanism. For example, a silicon island etch mask aperture pattern through which island 41 is defined in the wafer may be modified prior to the etch step(s), so as to relocate the aperture for island 41 to a new aperture for island 41S. Then, during the island formation etch step, that portion of the wafer containing particulate defect 41 will not be coincident with the island 41S and the "kill potential" of defect PD1 is negated. Namely, as viewed in FIG. 4, the physical location in the wafer of the island region for the P-channel load transistor 21 of the first inverter is shifted to the right as a new island region 41S.

Figure 5:
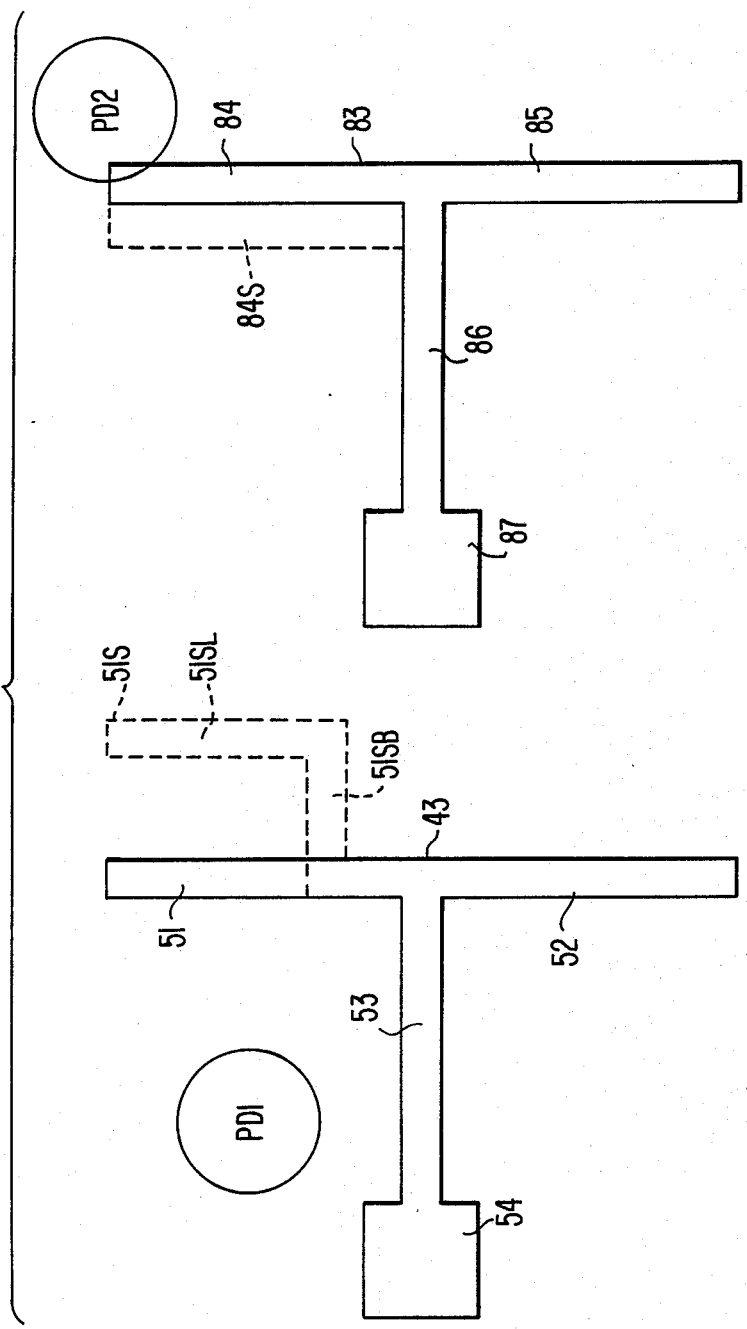

FIG. 5 shows the original polysilicon gate pattern for polysilicon gate lines 43 and 83 of the composite layout of FIG. 3, described above, and additional modified or shifted portions of the polysilicon gate layout resulting from the identification and avoidance of particulate defect PD1 and a second particulate defect PD2 that has been introduced into the fabrication process subsequent to the formation of island regions 41S, 42, 81, 82. In FIG. 5, the second particulate defect PD2 is shown as overlying a portion of the upper arm 84 polysilicon line 83. The shifting of the upper arm 84 to a new location 84S which avoids the particulate defect is also shown. In the left-hand portion of FIG. 5, the shifting of the upper arm 51 of the polysilicon gate line 43 due to the shifting of the island region 41 to a new location 41S, as described above, is also depicted. Upper arm 51 of polysilicon gate line 43 is shown as being shifted to the right (corresponding to the right-hand displacement of island region 41S) as a new upper arm 51S having an upper leg 51SL and a lower bar portion 51SB.

Figure 6:
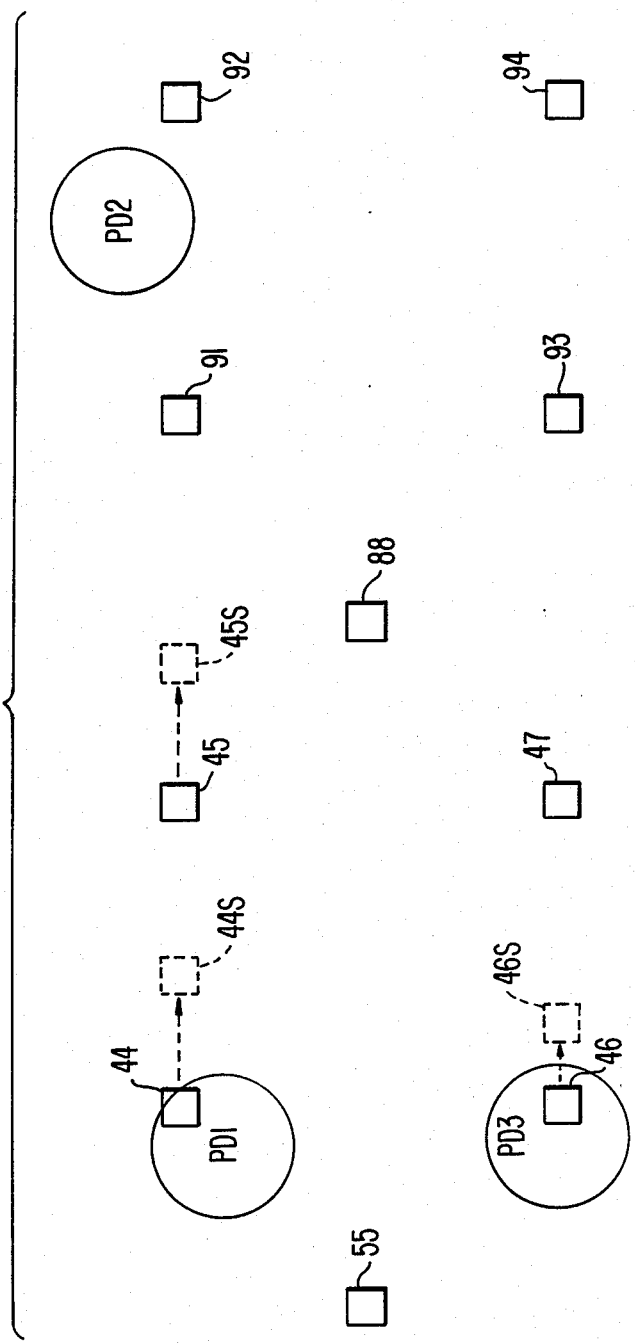

FIG. 6 shows the topological pattern for the contact apertures through which metallization is provided to respective regions of the transistors of the wafer. Also shown are the effective shifting of contact apertures 44 and 45 to the right to new locations 44S and 45S because of the abovedescribed shifting to the right of island 41S of the P-channel transistor 21. In addition, in the lower left-hand portion of FIG. 6 is shown a modification of the aperture pattern to shift contact via 46 to a new location 46S, so as to avoid a particulate defect PD3 which has been introduced into the process subsequent to the formation of polysilicon gates 43, 83 and which overlaps contact via 46.

Figure 7:
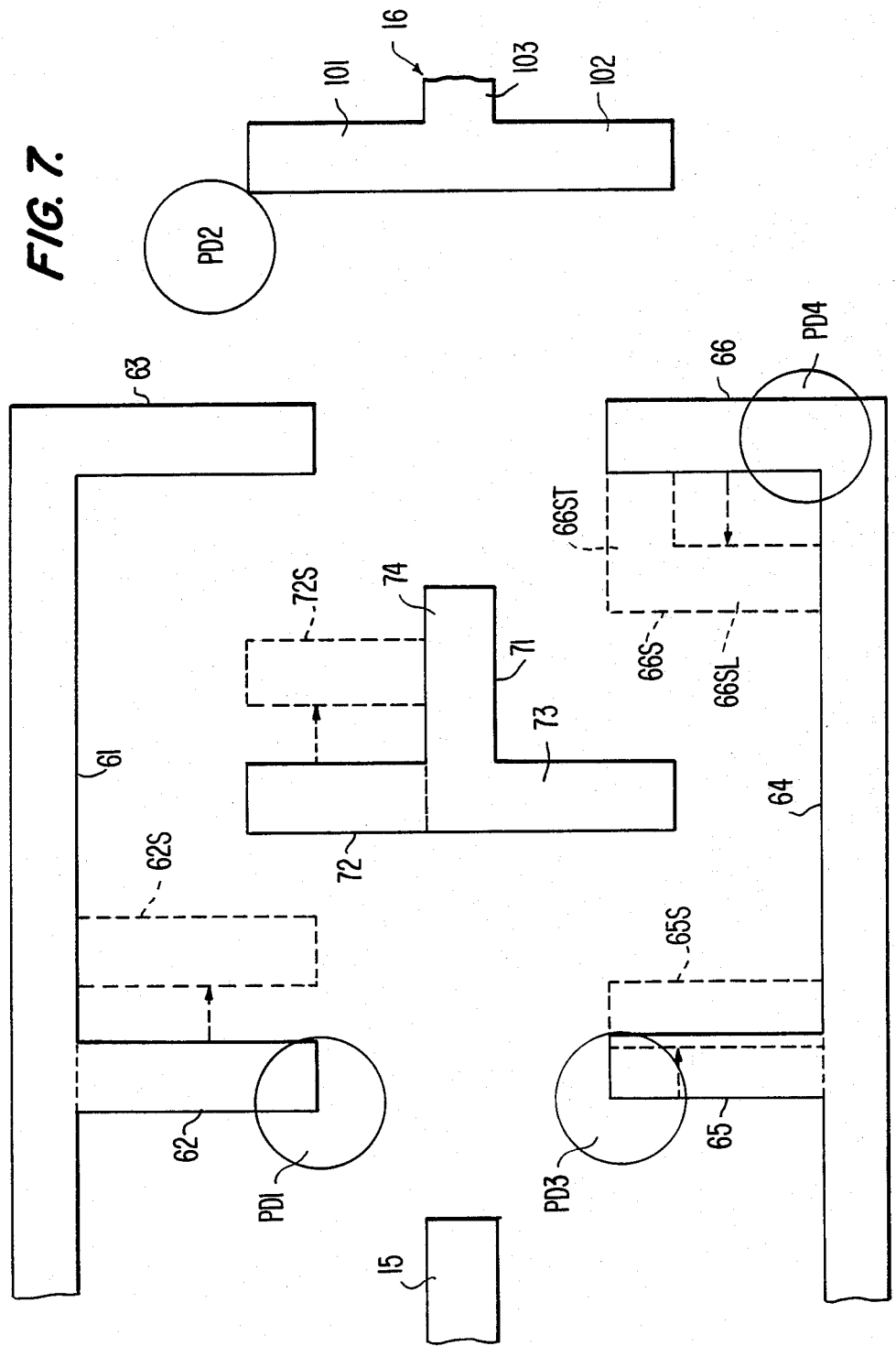

FIG. 7 shows the geometry of the topological layout for the metallization pattern portion of the composite layout of FIG. 3. Also shown in broken line form are modifications of the signal metallization patterns to avoid particulate defects that have been identified. It will be noted that particulate defect PD2 has no effect on the metallization pattern; however, particulate defect PD3, which impacts the location of the contact aperture 46, shown in FIG. 6, described above, also impacts the arm 65 of negative power supply metallization link 64. Arm 65 has been shifted to the right to a new location 65S to be coincident with contact aperture 46S and to avoid particulate defect PD3. Arms 62 and 72 of respective metallization links 61 and 71 have been shifted to the right to new locations 62S and 72S because of the shifting of the island region to a new location 41S as shown in FIG. 4, described above.

Further shown in FIG. 7 is a particulate defect PD4 which has been introduced into the fabrication process subsequent to the patterning of the polysilicon lines and which overlies arm 66 of lower metallization link 64. Because of particulate defect PD4, the metallization pattern for arm 66 is modified to a new location 66S which is shifted to the left of the original arm 66. New location 66S has an upper or top portion 66ST and a lower or leg portion 66SL which extends from link 64 to the top portion 66ST, thereby avoiding particulate defect PD4.

As pointed out above, in accordance with the present invention, during the respective steps of the fabrication process, the wafer is inspected (visually or electronically scanned) to identify and locate any particulate defects which have been introduced into the process and which would, without application of the avoidance technique of the present invention, constitute circuit killers. In the description to follow, the introduction of and avoidance of the above-referenced particulate defects PD1-PD4 shown in FIGS. 4-7 will be described.

Initially, the process begins with a wafer onto which the transistor island regions 41, 42, 81, 82 are to be etched. Prior to forming these island regions in the wafer (by etching away unwanted silicon) according to a prescribed mapping of the circuit functions into semiconductor regions, the wafer is scanned by a suitable microscopic imaging apparatus, such as an E-beam scanner or laser scanner, for the presence of defects which may have been introduced into the semiconductor processing environment, which defects, if permitted to coincide with the semiconductor architecture pattern, would effectively render the circuit useless. As a result of this initial scan, a particulate defect, denoted as particulate defect as PD1, is identified and located as being coincident with a substantial portion of the originally mapped topology of source region of transistor 21 which contains the contact aperture 44 and a portion of the metallization arm 62 of positive power supply link 61, as shown in FIG. 3A. Because the probability of converting this particular defect into a circuit defect is high, the geometry of the architecture topology shown in FIG. 3 must be modified. Since particulate defect PD1 resides in or on the wafer itself, region 41 is shifted to a new location. Accordingly, the original topology map of the island layout is modified, as by way of modification of an island etch mask, so that island 41, when formed in the wafer, is shifted to the right to a new location shown in broken line 41S in FIG. 4. With islands 41S, 42, 81 and 82 introduced into the wafer at the locations shown in FIG. 4, they will be arranged in a pattern which avoids the particulate defect PD1 so that the yield for these regions is predictably at a level of 100%.

Because of the shifting or modification of the location of island region 41 to new location 41S, subsequent levels of geometry employed in the fabrication process may also have to be modified. As shown in FIG. 5, because of the shifting to the right of the location of island region 41 to new location 41S, the upper arm 51 of polysilicon gate 43 is shifted to the right to a new location 51S by an amount corresponding to the shifting to the right of the region 41S in FIG. 4. This modification of the polysilicon gate changes the topological shape of the polysilicon gate from the original T-shape to one having an L-shaped upper armed portion comprising a upper leg 51SL and a lower bar portion 51SB as shown in FIG. 5. Similarly, FIG. 6 shows the displacement of source and drain contact apertures 44 and 45 to new locations 44S and 45S corresponding to the shifting to the right of the island region 41 in FIG. 4. FIG. 7 shows the modification of the metallization layers 61 and 71 wherein arm 62 of metallization layer 61 which extends to the contact aperture 44 in the source region portion of island 41 is shifted to a new locations 62S, whereas arm 72 of metallization link 71 is shifted to the right of new location 72S, so as to extend to the contact aperture 45 and thereby contact with the source region portion of the island region 41 at its new location 41S. With the mask through which the island regions of the transistors are formed having been corrected to avoid the particulate defect PD1 in the wafer proper, silicon is etched except for the areas of the corrected mask to leave intact the respective silicon islands 41S, 42, 81, 82 of the transistors 21, 22, 31, 32.

Mask features essentially identical to the island regions are used to control the threshold voltages for the respective transistors, as tabulated in the above Table for geometry levels GL1, GL2 and GL3.

After growth of the desired thickness of gate oxide (not shown), patterning of the polysilicon lines for the gates and gate interconnects of the transistors is carried out. Prior to patterning the polysilicon, the wafer is again inspected to determine whether any new particulates have been introduced. In the present example, it is assumed that a new particulate defect PD2, shown intersecting the upper arm 84 of polysilicon line 83 and overlapping a portion of the drain region of transistor 31, has been introduced into the fabrication environment. Because of the presence of particulate defect PD2, the intended geometry pattern of polysilicon gate line 83 must be modified to avoid the defect. Also, any other subsequent topology-defining patterns which will be impacted by the particular defect must be similarly modified, as was the case with particulate defect PD1, described above. Translation of the originally intended location of upper arm 84 to a new location 84S avoiding particulate defect PD2 is shown in the right-hand portion of FIG. 5. As can be seen from FIG. 3A, defect PD2 does not impact any other portion of the original design, so that there is no alteration or modification of the contact aperture layout of FIG. 6 or the metallization layout pattern of FIG. 7.

Figure 8:
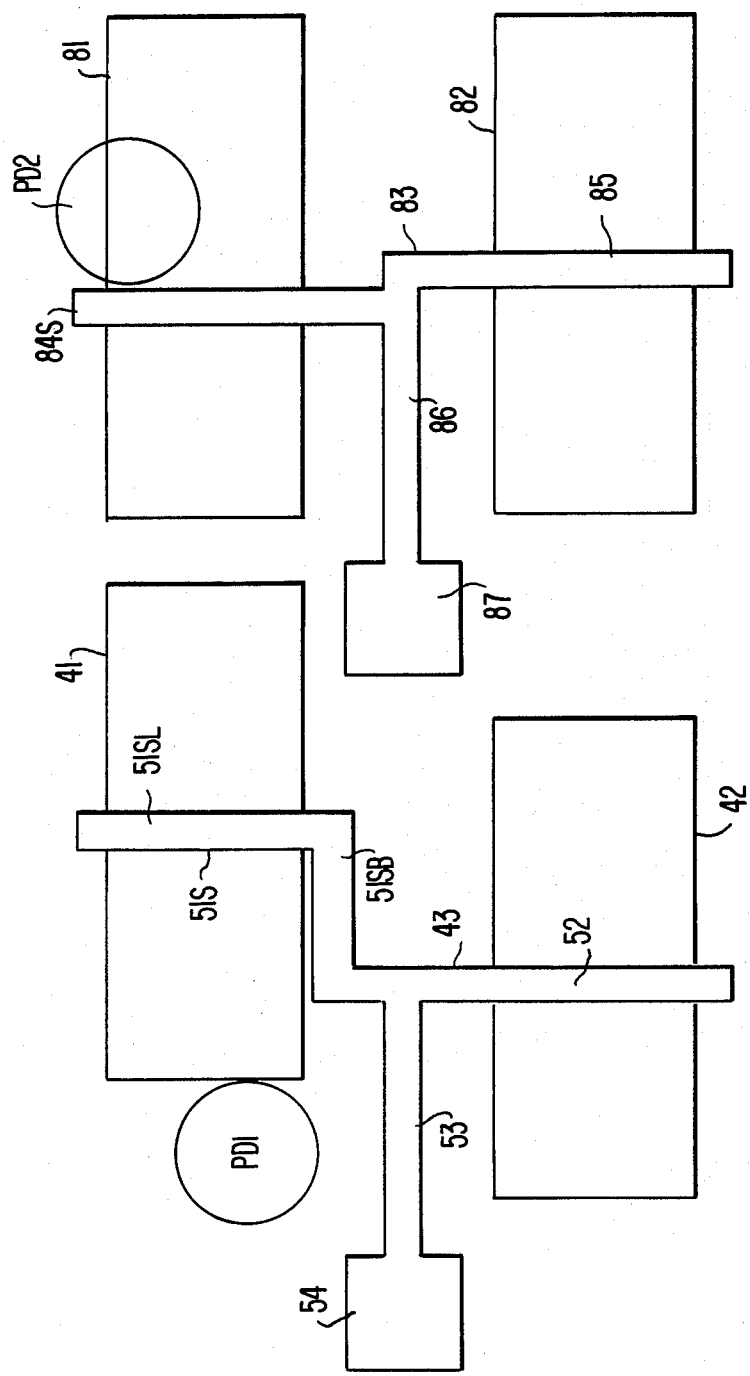
FIGS. 8–10 are diagrammatic illustrations of the topology of an integrated circuit layout for avoiding the particulate defects superimposed in the layout of FIG. 3 at respective stages of mask pattern modification.

Using the modified polysilicon gate pattern shown in FIG. 5, polysilicon lines 43 and 83, having respective shifted portions 51S and 84S, are formed over a previously applied insulator layer to result in a topological pattern structure as shown in FIG. 8. Namely, FIG. 8 shows the results of the formation of the island regions 41S, 42, 81, 82 and the polysilicon lines 53, 83 overlying the island regions using the modified geometry layout of FIGS. 4 and 5.

Figure 9:
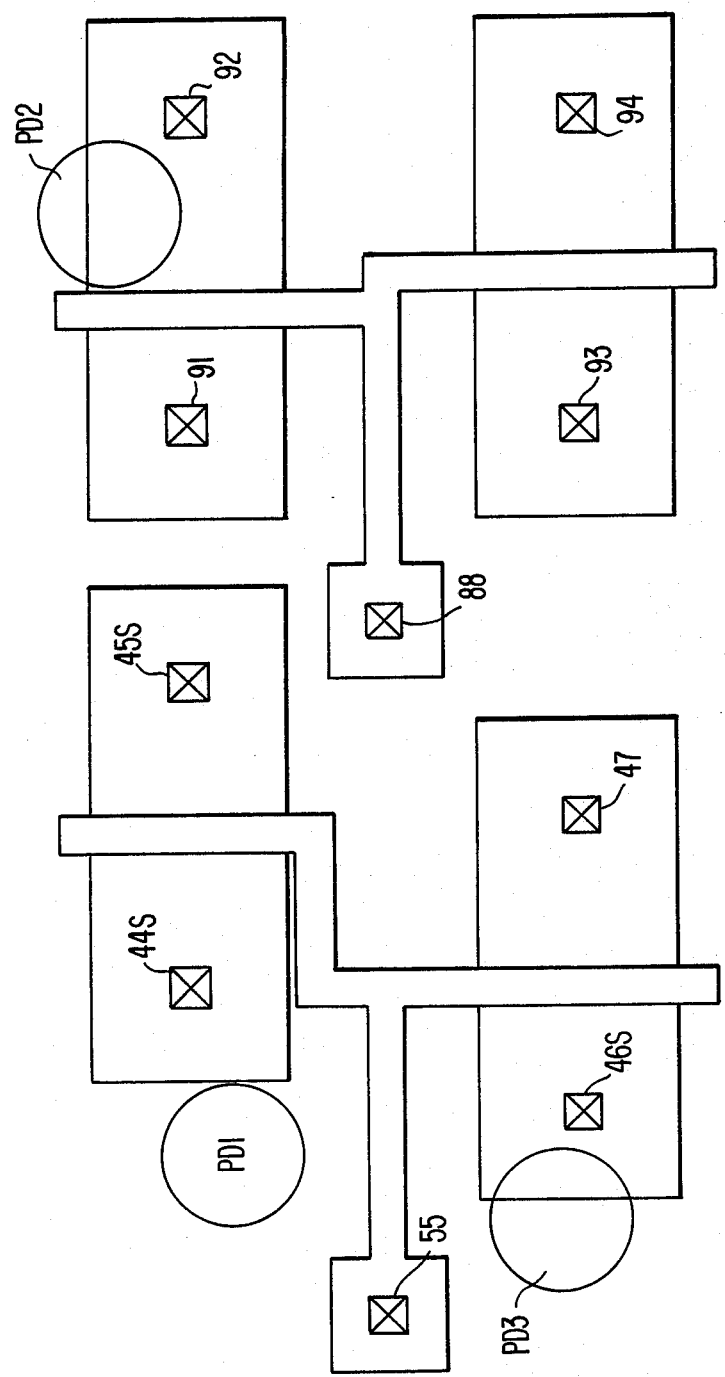
Figure 10:
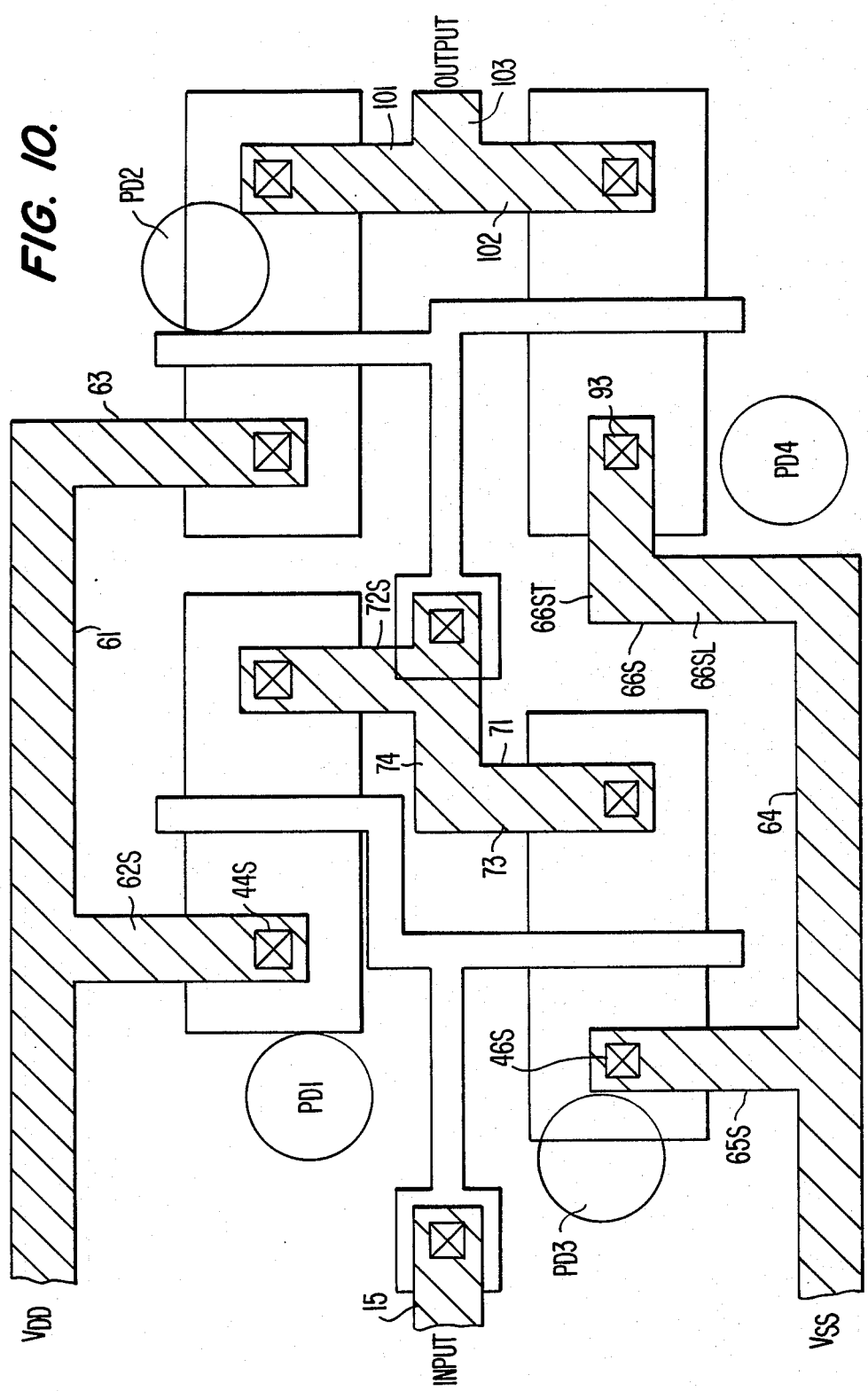

The next mask pattern for the manufacture of the topological layout shown in FIG. 3, is that employed for forming the metallization contact holes or vias, which are provided subsequent to the P+ and N+ impurity implants for geometry levels 5 and 6, set forth in the Table. As described above, because of the shifting to the right of island 41S, contact vias 44 and 45 have been shifted to the right to new locations 44S and 45S. Prior to use of the via mask, however, the structure is again scanned for the presence of any particulate defects which may have been introduced during the processing steps up to the present time. As shown in FIG. 6, for the present example, it is assumed that a particulate defect PD3 has been introduced at a location which is coincident with via 46. Its location in the source region of transistor 22 is shown in FIG. 3A as being coincident with via 46 and a portion of metallization arm 65. Because defect PD3 is coincident with via 46, the probability of its being converted into a killer defect, if processing of the via in the presence of the particulate defect PD3 takes place, is very high. Accordingly, it becomes necessary to move contact via 46 to a location which avoids particulate defect PD3. This is shown in FIG. 6 by the translation or shifting to the right of contact via 46 to a location 46S which still falls within the source region of transistor 22 but avoids the defect PD3. Because the contact via has been shifted to the right, it is also necessary to move the metallization arm 65 to a location which is coincident with the shifted contact via 46S. This is illustrated in FIG. 7 by the movement or translation of arm 65 to a new location 65S. Then, using the contact via mask having the modified pattern shown in FIG. 6, apertures are formed in an insulation layer which overlies the layout shown in FIG. 8 to produce the modified topology as shown in FIG. 9.

After formation of the contact vias, the metallization pattern is selectively formed over the surface of the overlying insulation layer to extend through the contact apertures to respective regions of the transistors and the polysilicon gates. Prior to this fabrication step, the structure is once again inspected for the presence of any particulate defects which may have been introduced into the processing environment. In the present example, it will be assumed that a new particulate defect PD4 is introduced at a location which impacts arm 66 of metallization link 64 and would thereby prevent the electrical contact of negative supply line 64 with the source of transistor 32. Because of the presence of this defect PD4, the metallization pattern must again be modified. This is shown in FIG. 7 wherein metallization arm 66 is modified to a new shape 66S having an upper or top portion 66ST extending via a leg portion 66D L to link 64. The end of top portion 66ST coincides with contact via or aperture 93, so as to provide a conductive path from the source region to the link 64. From FIG. 7, it can be seen that, because of the identification and location of particulate defects PD1–PD4 during examination of the wafer structure for successive processing steps, the final metallization pattern is considerably different from that as originally designed. However, this modified metallization pattern effectively ensures successful contact to each of the intended portions of the semiconductor structure and thereby a successful yield for the dual CMOS inverter as mapped into the modified semiconductor architecture. At the completion of the metallization step employing the modified metallization pattern shown in FIG. 7, the topology of the dual CMOS inverter architecture has a configuration shown in FIG. 10. As will be appreciated from a comparison of FIGS. 3A and 10, although the particulate defects PD1–PD4 have been incorporated into the completed architecture, their locations are not detrimental to the circuit. The in-process modifications of the mask patterns have circumvented the locations of the defects to realize a useful circuit.

In the foregoing description of the selective modification of geometry level patterns through which successive stages of fabrication of the integrated circuit architecture are implemented, the topology maps (FIGS. 4–7) have been described as being associated with respective masks through which the respective components (e.g. transistor islands, polysilicon gates, contact vias, metallization) of the integrated circuit are formed. It is to be understood that the term mask is not limited to a specific form or physical application but is to be considered as being associated with any patterning control environment and processing methodology, including but not limited to diffusion, ion implantation, photolithography, plasma processing, electron beam processing, X-ray patterning, etc. In those systems which employ topology map image data stored in an electronic data base for respective geometry levels, modification of topology data using the defect avoidance scheme of the present invention may be readily accomplished from the imaging console through which the topology patterns are generated, and from which scanning (e.g. E-beam or laser) of the wafer is carried out.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. For use in a process for manufacturing an integrated circuit, wherein components of an integrated circuit architecture are formed in semiconductor material and interconnected through conductive highways therebetween in accordance with a prescribed architecture pattern representative of the circuit functions to be performed by said integrated circuit, a method of controlling said process so as to avoid the impact of particulate defects that are introduced into said architecture during the execution of process steps through which said integrated circuit is produced comprising the steps of:

(a) examining material to be employed in a respective processing step for the presence of particulate defects; and (b) in response to step (a) detecting the presence of a particulate defect the location of which adversely impacts at least one component of said integrated circuit, modifying at least one portion of the material to be employed in said respective processing step, so as to effectively geometrically reconfigure said prescribed architecture pattern while retaining the circuit functions to be performed by said integrated circuit.

2. A method according to claim 1, wherein said process includes the use of a plurality of architecture topology-defining mask patterns through which the makeup, arrangement and interconnection of the components of said integrated circuit architecture are initially geometrically prescribed, and wherein step (b) comprises selectively modifying said mask patterns so as to effectively change the configurations of said patterns, whereby particulate defects, the locations of which would adversely impact the architecture resulting from said initially geometrically prescribed patterns, lie outside the selectively modified mask patterns and are thereby effectively avoided in the integrated circuit architecture produced thereby.

3. A method according to claim 2, wherein step (a) comprises, for preselected steps in said process wherein respective mask patterns are to be employed for defining respective portions of said architecture, scanning the semiconductor structure to which a respective mask pattern is to be applied for the presence of particulate defects therein.

4. A method according to claim 3, wherein step (a) comprises scanning said semiconductor structure with a prescribed energy beam and deriving therefrom an output signal representative of said structure including particulate defects that have been introduced therein.

5. A method according to claim 4, wherein step (b) comprises comparing said output signal with a reference signal representative of intended topological characteristics of said structure as defined by said respective mask pattern and, in response to said comparison indicating the coincidence of the location of a detected particulate defect and a prescribed portion of said mask pattern, modifying said prescribed portion of said mask pattern to remove said coincidence.

6. A method according to claim 2, wherein step (c) comprises, for preselected steps in said process wherein respective mask patterns are to be employed for defining respective portions of said architecture, generating a first signal representative of an image of the semiconductor structure to which a respective mask pattern is to be applied, and step (b) comprises comparing said first signal with a second signal representative of an image of intended topological characteristics of said structure as defined by said respective mask pattern and, in response to said comparison indicating the coincidence of the location of a detected particulate defect and a preselected portion of said mask pattern, modifying said preselected portion of said mask pattern to remove said coincidence.

7. A method according to claim 6, wherein step (b) includes selectively modifying that portion of a mask pattern, to be employed in said process subsequent to said respective processing step, which is coincident with said preselected portion.

8. For use in a process for manufacturing an integrated circuit wherein components thereof reside and are interconnected in a semiconductor architecture in accordance with respective circuit patterning steps, a method of controlling said process so as to avoid the adverse impact of particulate defects that are introduced into said architecture in the course of the execution of process steps through which said integrated circuit is produced comprising the steps of:

(a) for selected ones of said circuit patterning steps, examining said semiconductor architecture for the presence of particulate defects; and (b) in response to step (a) detecting the presence of a particulate defect the location of which adversely impacts at least one component of said integrated circuit, modifying said circuit patterning steps, so as to effectively reconfigure the topological pattern of said architecture produced thereby and avoid the coincidence of a prescribed portion of said pattern and said particulate defect.

9. A method according to claim 8, wherein said circuit patterning steps include the use of respective architecture topology-defining mask patterns through which the makeup, arrangement and interconnection of the components of said integrated circuit are geometrically prescribed prior to the execution of said patterning steps; and wherein step (b) comprises selectively modifying said mask patterns so as to effectively change the configurations of said patterns, whereby particulate defects, the locations of which would adversely impact the integrated circuit resulting from the use of unmodified mask patterns, lie outside the selectively modified mask patterns and are thereby effectively avoided in the integrated circuit produced thereby.

10. A method according to claim 9, wherein step (b) includes selectively modifying that portion of a mask pattern to be employed in a patterning step subsequent to a patterning step for which a particulate defect is to be avoided, which portion is coincident with the location of said particulate defect.

11. A method according to claim 9, wherein, for each of said patterning steps, a respective mask pattern is to be employed for defining a respective portion of said integrated circuit and step (a) comprises generating a first signal representative of an image of the semiconductor architecture to which said respective mask pattern is to be applied, and step (b) comprises comparing said first signal with a second signal representative of an image of intended topological characteristics of said semiconductor architecture as defined by said respective mask pattern and, in response to said comparison indicating the coincidence of the location of a detected particulate defect and a preselected portion of said mask pattern, modifying said preselected portion of said mask pattern so as to remove said coincidence.

12. An integrated circuit made by the process of claim 1.

13. An integrated circuit made by the process of claim 8.

* * * * *